US012596139B1

(12) United States Patent
Gruber

(10) Patent No.: US 12,596,139 B1
(45) Date of Patent: Apr. 7, 2026

(54) METHOD AND APPARATUS FOR ESTIMATING ELAPSED POWER CONSUMPTION OF ELECTRONIC DEVICES

(71) Applicant: Trident IoT, LLC, San Diego, CA (US)

(72) Inventor: Brandon Gruber, San Marcos, CA (US)

(73) Assignee: Trident IoT, LLC, Carlsbad, CA (US)

( * ) Notice: Subject to any disclaimer, the term of this patent is extended or adjusted under 35 U.S.C. 154(b) by 0 days.

(21) Appl. No.: 18/910,432

(22) Filed: Oct. 9, 2024

(51) Int. Cl.
*G01R 22/06* (2006.01)
*G01R 31/387* (2019.01)

(52) U.S. Cl.
CPC ......... *G01R 22/061* (2013.01); *G01R 31/387* (2019.01)

(58) Field of Classification Search
CPC ......... Y02E 60/10; Y02E 10/76; Y02D 30/70; Y02D 30/00; Y02T 90/167; Y02T 10/92; Y02T 30/00; Y02T 10/30; G06F 1/3206; G06F 1/3203; G06F 1/3212; G06F 1/3209; G06F 11/3058; G06F 2221/2149; G06F 1/266; G06F 17/15; G06F 1/1635; H01M 2010/4271; H01M 8/04619; H01M 10/482; H01M 8/04604; H01M 8/0491; H01M 8/04761; H01M 10/625; H01M 8/04664; H01M 10/4285; H01M 8/06; H01M 8/04179; H01M 8/04686; H04W 52/0261; H04W 4/029; H04W 52/0251; H04W 52/02; H04W 4/02; H04W 24/08;

H04W 56/001; G01R 31/392; G01R 31/36; G01R 31/382; G01R 31/3835; G01R 31/3842; G01R 19/165; G01R 19/16542; G01R 22/063; G01R 31/52; G01R 31/385; G01R 19/12; G01R 23/16; G01R 31/364; G01R 31/378; G04F 5/00; G04F 10/00; G04F 8/006; G04F 8/00
See application file for complete search history.

(56) References Cited

U.S. PATENT DOCUMENTS

| | | | | |
|---|---|---|---|---|
| 8,051,318 B2 * | 11/2011 | Mizutani | ............... | G06F 1/3203 |
| | | | | 713/340 |
| 8,332,678 B1 * | 12/2012 | Mahalingam | ......... | G06F 1/3212 |
| | | | | 713/340 |
| 10,871,818 B1 * | 12/2020 | De La Cropte De Chanterac | ...... | |
| | | | | G06F 1/325 |
| 10,884,475 B1 * | 1/2021 | Wang | .................... | G06F 1/3296 |
| 11,531,388 B2 * | 12/2022 | Yeh | .......................... | G06F 1/324 |

* cited by examiner

*Primary Examiner* — Vinh P Nguyen
(74) *Attorney, Agent, or Firm* — Thomas Thibault

(57) ABSTRACT

Embodiments of a system, method and apparatus are described for estimating the elapsed power consumption of an electronic device. A plurality of power consumption rates is associated with a plurality of operating states, respectively, of one or more electronic components of an electronic device. As the electronic device operates over the plurality of operating states, a partial battery consumption estimate is calculated for the time spent in each state, multiplied by a respective power consumption rate in each particular operating state. A summation of the partial battery consumption estimates is summed to produce an elapsed power consumption by the electronic device.

20 Claims, 13 Drawing Sheets

Store Power Consumption Rates — 400

Energize Battery-Powered Electronic Device — 402

Determine If Battery New — 404

Configure Accumulator — 406

Receive Indication of Operating State — 408

Begin Counter — 410

Change in Operating State — 412

Second Indication Received of Change in Operating State — 414

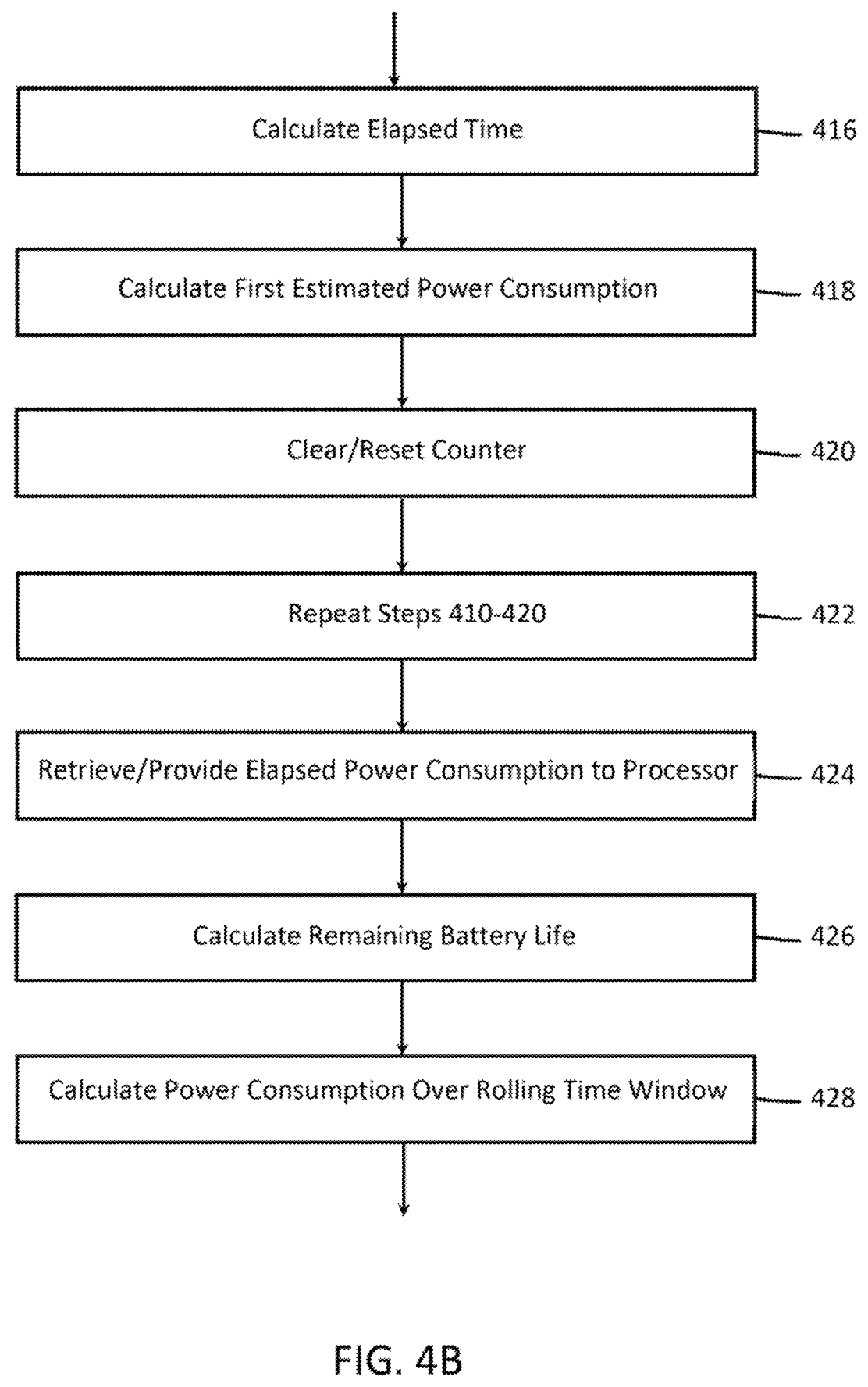

Calculate Elapsed Time — 416

Calculate First Estimated Power Consumption — 418

Clear/Reset Counter — 420

Repeat Steps 410-420 — 422

Retrieve/Provide Elapsed Power Consumption to Processor — 424

Calculate Remaining Battery Life — 426

Calculate Power Consumption Over Rolling Time Window — 428

FIG. 4B

Store Elapsed Power Consumption Before De-Energization — 430

Add Third Estimated Power Consumption to Elapsed Power Consumption — 530

Calculate Fourth Estimated Power Consumption — 532

Retrieve Elapsed Power Consumption Estimate/ Calculate Remaining Battery Life — 534

Store Power Consumption Rates — 800

Energize Battery-Powered Electronic Device — 802

Receive First and Second Indications of Operating States — 804

Retrieve First Power Consumption Rate — 806

Retrieve Second Power Consumption Rate — 808

Add First and Second Power Consumption Rates — 810

Receive Clock Tick Signal — 812

Increment/Decrement Accumulator — 814

Retrieve Elapsed Power Consumption Estimate/
Calculate Remaining Battery Life — 816

METHOD AND APPARATUS FOR ESTIMATING ELAPSED POWER CONSUMPTION OF ELECTRONIC DEVICES

BACKGROUND

I. Field of Use

The present application relates generally to electronic devices and more specifically to various embodiments of a system, apparatus and method for estimating the power consumption of electronic devices or components thereof.

II. Description of the Related Art

It is often desirable to know how much power an electronic device, or one or more of its components, uses over time. This may be used to develop or troubleshoot an electronic device. In electronic devices, the estimated power consumption may be used to determine the estimated remaining battery life of a battery that powers a device.

A standard technique is to read a battery voltage of an electronic device over time and as the voltage sags over hours, days, weeks or months, an estimate of the power used may be derived. Many battery-powered devices use lithium-ion batteries that have a relatively flat non-linear discharge voltage curve over time. Thus, it is difficult to determine the power consumed or a remaining battery life. There is not a simple mechanism to simply read the voltage to determine at a given time to know how much battery power is left in a simple lithium-ion battery like a coin cell. Battery life estimation in software is complex and reserved for complex, expensive devices.

SUMMARY

Embodiments of the present invention are directed towards systems, methods and apparatus for determining an estimated power consumption of an electronic device, and/or one or more active electronic components thereof. In one embodiment, an electronic device is described, comprising a battery, an active electronic component powered by the battery, operating in a plurality of operating states over time, and power consumption measurement circuitry, configured to determine an elapsed power consumption of the electronic device, the elapsed power consumption of the electronic device comprising a summation of a plurality of partial power consumption estimates associated with at least the active electronic component, each partial power consumption estimate comprising a power consumption rate associated with each of the plurality of operating states multiplied by an elapsed time spent in each of the plurality of operating states, respectively.

In another embodiment, a method is described for determining an elapsed power consumption of an electronic device, comprising determining a plurality of partial power consumption estimates associated with a first active component of the electronic device, each partial power consumption estimate comprising a power consumption rate associated with the first active component in each of a plurality of operating states multiplied by an elapsed time spent in each of the plurality of operating states, respectively, and summing the plurality of partial power consumption estimates to produce the elapsed power consumption.

BRIEF DESCRIPTION OF THE DRAWINGS

The features, advantages, and objects of the present invention will become more apparent from the detailed description as set forth below, when taken in conjunction with the drawings in which like referenced characters identify correspondingly throughout, and wherein:

FIGS. 4A-4C represent a flow diagram illustrating one embodiment of a method for estimating a remaining battery life of the electronic device of FIG. 1 (or, conversely, estimating an elapsed power consumption of the electronic device);

DETAILED DESCRIPTION

Embodiments of a system, method and apparatus are described for determining an estimated battery life for an electronic device (or, conversely, estimating an elapsed power consumption of an electronic device and/or one or more components thereof). A number of power consumption rates are stored in association with one or more active electronic components of an electronic device, and also in association with a particular operating state of each of the one or more active electronic components. An elapsed time spent in each operating state is determined, and each elapsed time is multiplied by an associated power consumption rate commensurate with a particular operating state, each referred to herein as a "partial power consumption estimate". An elapsed power consumption of the electronic device as a whole may be obtained by summing the partial power consumption estimates. An elapsed power consumption of one or more active electronic components may be obtained by tracking partial power estimates associated with the one or more active electronic components. For a battery-powered electronic device, a remaining battery life may be estimated by summing the partial power consumption estimates and subtracting from a power capacity of a battery of the electronic device. Each active component being monitored for power consumption may change operating state independently of other components. As used herein, "component" may mean one or more electronic components that consume power and "power consumption" may refer to an amount of current used over time or an amount of power used over time.

Figure 1:
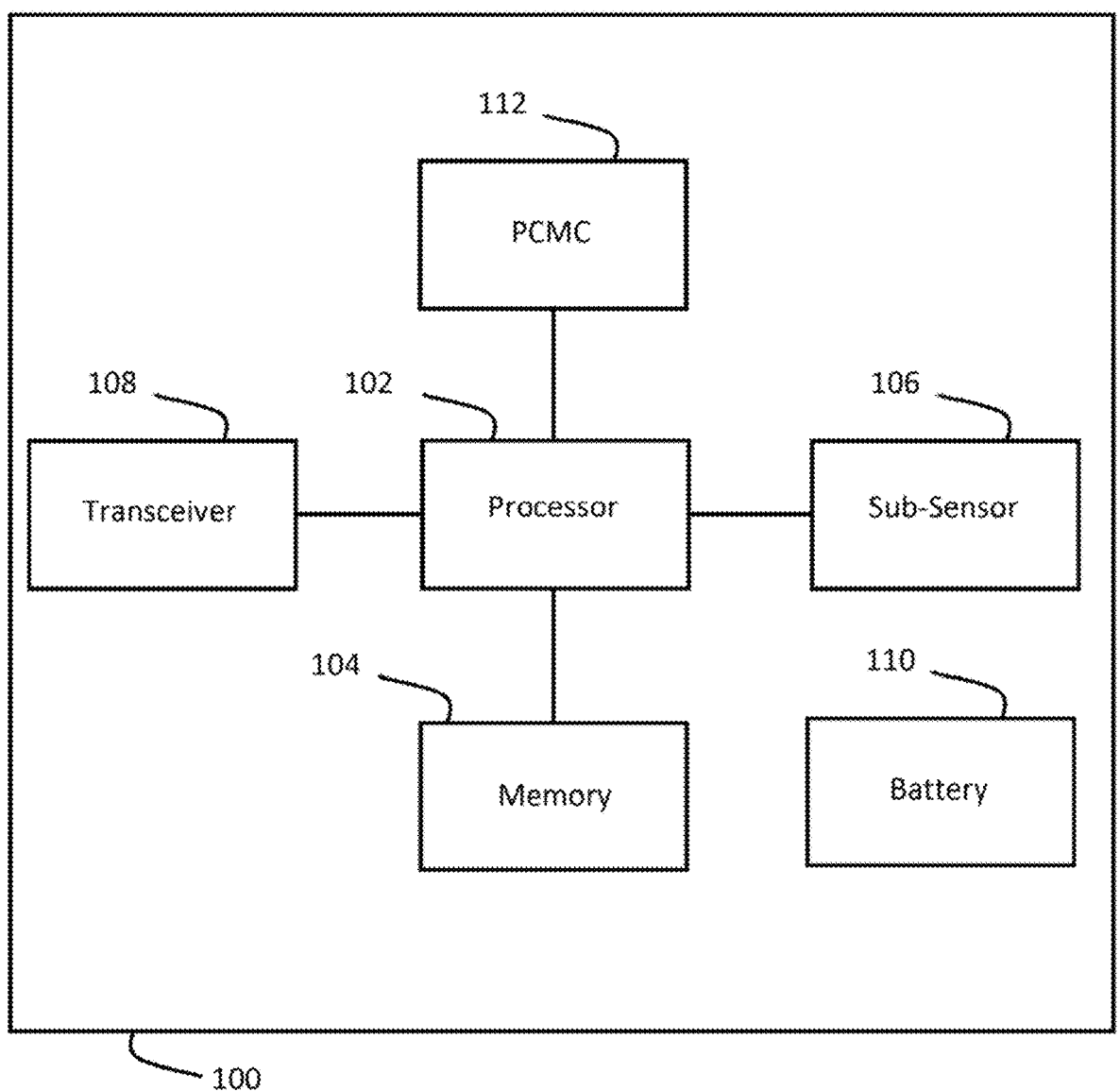
FIG. 1 is a functional block diagram of one embodiment of an electronic device in accordance with the inventive principles discussed herein.

FIG. 1. is a functional block diagram of one embodiment of an electronic device 100 in accordance with the inventive principles discussed herein. In this particular embodiment, electronic device 100 is powered by battery 110, although the following discussion may be applicable to electronic devices powered by dedicated power, such as from a standard AC outlet, typically using an internal transformer and regulation circuitry. Examples of electronic device 100 may include a wide variety of sensors, such as security sensors, environmental sensors, shock/vibration sensors or any other electronic sensor used in residential and commercial environments. Electronic device 100 may alternatively comprise other electronic devices such as electronic toys, radios, smart phones, smart phones, smart wearable devices, or just about any electronic device.

Shown in FIG. 1 is processor 102, memory 104, sub-sensor 106, transceiver 108, battery 110 and power consumption measurement circuitry (PCMC) 112. It should be understood that the functional blocks shown in FIG. 1 are merely exemplary, and that in other embodiments, electronic device 100 may comprise fewer, or additional, functional blocks, different functional blocks depending on a type of electronic device 100, that the functional blocks may be coupled to one another in a variety of ways, and some functional blocks are not shown, such as a user interface, for clarity purposes. In one embodiment, some or all of the functional blocks shown in FIG. 1 may be integrated into a single die, custom ASIC, System-on-Chip (SoC), System-in-Packaging (SiP), modules, or similar. Examples of integration of the various functional blocks of FIG. 1 may include a Zwave® EFR32ZG23 system-on-chip, a Zwave ZGM230S module, a Zigbee® EFR32MG1, etc. The various functional blocks shown in FIG. 1 are coupled to each other via one or more data, control and address buses, as is well-known in the art.

Processor 102 comprises a digital processor for executing processor-executable computer instructions stored in memory 104 for providing operational functionality of electronic device 100. Processor 102 may comprise one or more processing cores (each core may be referred to herein as a "processor"), microprocessors, microcomputers, microcontrollers, custom ASICs, or the like, and where two or more processors are used, each of the processors, either alone or in combination, may execute one or more of the processor-executable instructions that cause processor 102 to perform various functions. Processor 102 may be selected based on a variety of factors, including processing power, power-consumption, size, and cost. In one embodiment, processor 102 comprises an ARM Cortex-M33 core processor, however other, similar core processors may be used alternatively.

Memory 104 is coupled to processor 102, comprising one or more information storage devices, such as RAM, ROM, flash memory, or some other type of electronic, optical, or mechanical memory device(s). Memory 104 is used to store processor-executable instructions for functional operation of electronic device 100, as well as any information used by processor 102, such as register values, counter values, addressing information, status information, etc. In some embodiment, memory 104 may store information related to battery consumption, such as a power capacity of battery 110, an elapsed power consumption estimate, a plurality of partial power consumption estimates, each associated with a particular active electronic component or components of electronic device 100, one or more power consumption rates associated with one or more operating states of one or more active electronic component or components of electronic device 100, etc. The processor-executable instructions may comprise instructions in accordance with well-known IoT protocols, such as the well-known Zwave or Zigbee protocols. It should be understood that memory 104 is non-transitory, i.e., it excludes propagating signals, and that in some embodiments, memory 104 may be incorporated into processor 102, such as the case where processor 102 comprises a microcomputer, microcontroller, custom ASIC, etc.

Transceiver 108 comprises an RF transceiver for sending and receiving wireless communication signals with other devices, typically within a local-area network. Transceiver 108 typically comprises a low-power transceiver suitable for electronic devices. Transceiver 108 sends and receives wireless communication signals typically in accordance with one or more well-known local, wireless, communication protocols, such as the well-known Zwave and Zigbee protocols.

Sub-sensor 106 comprises one or more sensors for determining a condition, status, characteristic of electronic device 100 or its surrounding environment. Typical sub-sensors may comprise a reed switch, a PIR, a thermal sensor, a pressure sensor, or virtually any sensor that detects a physical property and converts it into electronic signals. Such sub-sensors are well-known in the art.

Battery 110 provides power to the components of electronic device 100 in embodiments where electronic device 100 is battery-powered typically a small, DC voltage between 3 and 9 volts, and may have a power capacity ranging between approximately 30 mAh (for a CR1025 coin cell battery) to approximately 500 mAh for a typical 9-volt battery.

PCMC 112 is used in embodiments where a separate, hardware-based power consumption circuitry is desired. In other embodiments, PCMC 112 is not used and instead, power consumption estimates are performed in software, executed by processor 102 via the processor-executable instructions stored in memory 104.

PCMC 112 may comprise memory registers, logic circuitry, internal resistors, transistors or other discreet components, one or more timers and/or one or more state machines for calculating an elapsed power consumption estimate, i.e., an estimate of power consumed by electronic device 100 and/or one or more active electronic components over time. PCMC 112 may calculate the elapsed power consumption estimate by tracking the power consumption of individual components, groups of components or electronic device 100 as a whole, over time. Specifically, each individual component, group of components or electronic device 100 is associated with a power consumption rate and, in some embodiments, a power consumption rate associated with two or more operating states of a particular individual component, group of components or electronic device 100.

For example, in an embodiment where the power consumption of processor 102, transceiver 108 and the remaining circuitry of electronic device 100 is monitored, PCMC 112 may store a power consumption rate for each of processor 102, transceiver 108 and the remaining circuitry of electronic device 100. In another embodiment, multiple power consumption rates may be stored for each of processor 102, transceiver 108 and the remaining circuitry of electronic device 100, respectively, each power consumption rate associated with an operating state of each of processor 102, transceiver 108 and the remaining circuitry of electronic device 100, respectively For example, a power consumption rate of 90 μAh may be stored for processor 102 in an active state of operation and a power consumption rate of 10 μAh may be stored for processor 102 in a quiescent state of operation. A power consumption rate of 50 μAh may be stored for transceiver 108 while transceiver 108 is actively transmitting information (i.e., a transmitting state), a power consumption rate of 8 μAh may be stored for transceiver 108 while receiving information (i.e., a receiving state) and a power consumption rate of 2 μAh while in a quiescent state (i.e., neither receiving or transmitting). An average, fixed power consumption rate of 12 μAh may be stored for the remaining circuitry of electronic device 100, representing an estimate of power consumption of relatively low-power components of electronic device 100 that typically do not operate in more than one operating state.

After initially energizing electronic device 100, PCMC 112 may begin calculating an elapsed power consumption estimate based on the amount of time each component or components is in each particular operating state and a power consumption rate associated with a component and its operating state. As time goes on, and electronic device 100 performs its intended functions, each of the components may enter and exit various operating states, and PCMC 112 may calculate a partial power consumption estimate for each of the components during each operating state.

Figure 2:
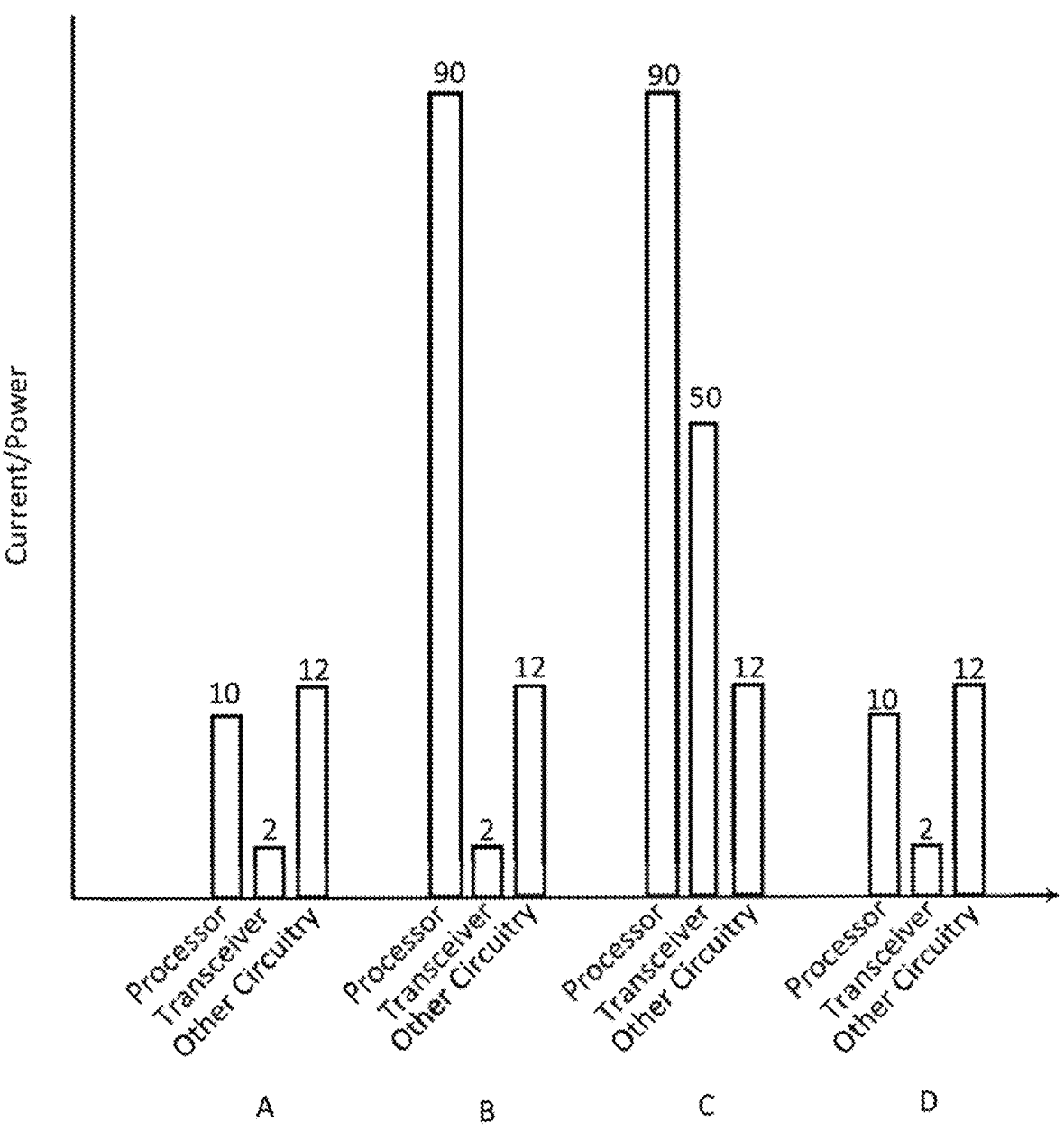
FIG. 2 is a graph illustrating how a processor, transceiver and other circuitry of the electronic device of FIG. 1 consumes power over time.

FIG. 2 is a graph illustrating how processor 102, transceiver 108 and the remaining circuitry of electronic device 100 consume power over time. It should be noted that the time axis may not be proportional among times A, B, and C. In this example, electronic device 100 comprises a wireless door/window security sensor that monitors doors and windows in a security system. During time A, which in this example lasts 2 minutes, electronic device 100 monitors a door or window to determine when it has been opened, with processor 102 and transceiver 108 each in a quiescent state, consuming 10 μAh and 2 μAh, respectively, and the remaining circuitry consumes 12 μAh of power, on average.

Time B begins when a door or window is opened, in this example two minutes after processor 102 and transceiver 108 are in the quiescent state, causing processor 102 to exit the quiescent state and enter into an active state, based on an internal interrupt being generated, for example, in response to detecting that the door or window has been opened. At or near the start of Time B, a calculation may be performed to determine a first partial power consumption estimate of electronic device 100 based on a summation of the individual power consumption of processor 102, transceiver 108 and the remaining circuitry over time A, in this case, two minutes, which equates to 0.33 μA (power consumed by processor 102 in the quiescent state)+0.07 μA (power consumed by transceiver 108 in the quiescent state)+0.40 μA (power consumed by remaining circuitry in the quiescent state)=0.80 μA of power consumed during period A. This result is typically stored in memory 104 or by a memory of PCMC 112.

The power consumption rate of processor 102 in the active state, in this example, is 90 μAh. Neither transceiver 108 nor the remaining circuitry changes state, continuing to draw power at a rate of 2 μAh and 12 μAh, respectively.

When processor 102 causes transceiver 108 to transmit a message in response to detecting that a door or a window has been opened, for example, time period C begins, and a calculation may be performed to determine a second partial power consumption estimate of electronic device 100 based on a summation of the individual power consumption of processor 102, transceiver 108 and the remaining circuitry over time B, in this case, 20 seconds, which equates to 0.50 μA (power consumed by processor 102 in the active state)+0.01 μA (power consumed by transceiver 108 in the quiescent state)+0.07 μA (power consumed by remaining circuitry in the quiescent state)=0.58 μA of power consumed during period B. This result is added to the power consumed during period A and the total stored in memory, for an elapsed power consumption of 0.8+0.58=1.38 μA. This result may be stored in memory 104 or by a memory of PCMC 112.

At time C, in this example lasting 40 seconds, processor 102 remains in the active state while transceiver 108 enters the "transmitting" state, due to, for example, processor 102 determining that information should be transmitted. The power consumption rate of transceiver 108 in the transmitting state, in this example, is 50 μAh. The remaining circuitry, i.e., excluding processor 102 and transceiver 108, continues to draw power at a rate of 12 μAh.

After the transmission has been completed, time D begins, and a calculation may be performed to determine a third partial power consumption estimate based on a summation of the individual power consumption of processor 102, transceiver 108 and the remaining circuitry over time B, in this case, 40 seconds, which equates to 1.00 μA (power consumed by processor 102 in the active state)+0.56 μA (power consumed by transceiver 108 in the active state)+0.14 μA (power consumed by remaining circuitry in the quiescent state)=1.70 μA of power consumed during period B. This result is added to the previous sum of 1.38 μA for an elapsed power consumption of 3.08 μA and stored in memory.

During time D, both processor 102 and transceiver 108 again enter the quiescent state, and this process continues, generating partial power consumption estimates each time that either processor 102 or transceiver 108 changes state. In another embodiment, separate timers may be used to track changes in state of one or more components of electronic device 100 so that a summation of estimated power consumptions of each component is calculated, and then the sums added together. In yet another embodiment, the power consumption rate of each component, group of components and/or electronic device 100 as a whole is continuously summed, and the summed power consumption rate is incrementally added to a cumulative power consumption over time to produce a power consumption estimation of electronic device 100.

Figure 3:
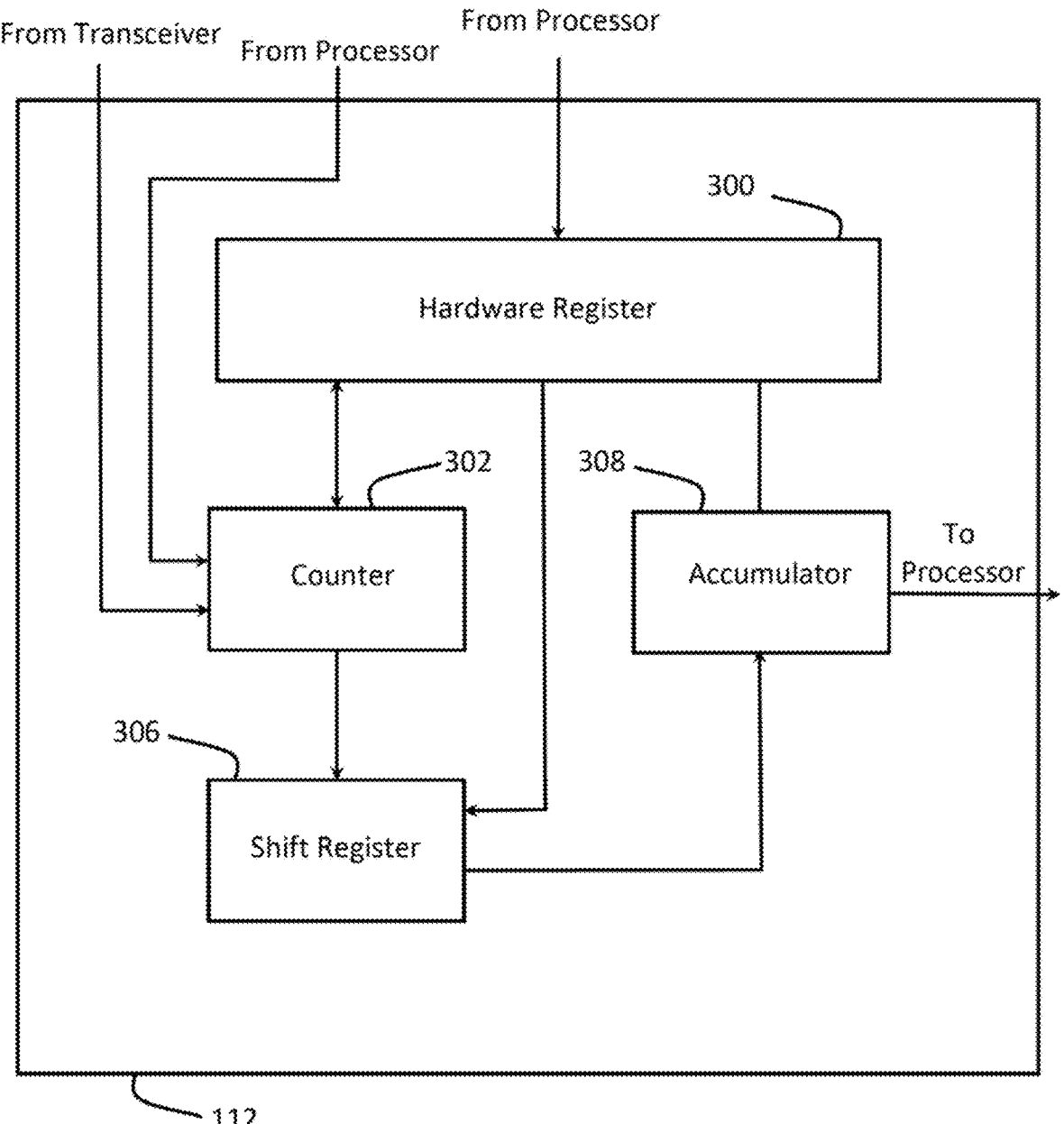
FIG. 3 is a functional block diagram of one embodiment of power consumption measurement circuitry (PCMC) in a hardware-based application where dedicated hardware is used to calculate the power consumption of the electronic device of FIG. 1.

FIG. 3 is a functional block diagram of one embodiment of PCMC 112 in an embodiment where dedicated hardware is used to calculate the power consumption of electronic device 100, rather than processor 102 via processor-executable instructions. In this embodiment, hardware register 300 is used to store one or more power consumption rates of one or more components of electronic device 100, some component or components associated with two or more power consumption rates of particular operating states of such component or components. Register 300 may also store a time when a change in state of one or more components of electronic device 100 occurs, for use in calculating elapsed times spent in each operating state. Continuing with the example above, hardware register 300 stores a power consumption rate of 10 μAh associated with processor 102 operating in a quiescent state, a power consumption rate of 90 μAh associated with processor 102 in an active state, a power consumption rate of 2 μAh associated with transceiver 108 operating in a quiescent state, a power consumption rate of 50 μAh associated with transceiver 108 operating in an active state and a power consumption rate of 12 μAh associated with the remaining circuitry (i.e., all circuitry except processor 102 and transceiver 108) of electronic device 100.

As time goes by, and various components of battery-power electronic device 100 enter different operating states, indications of such state changes may be provided to counter 302, in some embodiments, via a multiplexer (not shown). The indications may be provided by processor 102 and/or other components, such as transceiver 108. The indications may comprise interrupts that are normally generated by processor 102 and/or other components as each component changes operating state.

Counter 302 provides an elapsed time that each component or components spends in any particular operating state. In one embodiment, the elapsed time is a measurement of time between a start time of when any one component or components changes state and an end time when the same or another component or components changes state. In another embodiment, the elapsed time is a measurement of time between a start time of when electronic device 100 changes from one operating state to another and an end time when the electronic device 100 again changes state. For example, electronic device 100 may operate in an active and a quiescent state, where in the active state, electronic device 100 may perform calculations, transmit or receive information, or, generally, perform its intended function, while in the quiescent state, electronic device 100 does not perform such functions and merely waits for a predetermined action occurs, such as a change in environmental conditions, a change in a power capacity of battery 110, physical state or property of electronic device 100, etc. In yet another embodiment, a plurality of counters 302 may be used, each counter assigned for monitoring a particular component or group of components to determine state changes and for determining an elapsed time that each component or group of components has spent in each operating state.

In any case, when counter 302 determines a change in state, it begins counting until it receives another indication of a state change. In one embodiment, upon determining a state change, a current time is compared to a previous time stored in register 300 to determine an elapsed time spent in a particular operating state. The previous time may then be replaced by the current time as the start time of a next operating state. In another embodiment, upon determining a state change, the count of counter 302 is stored in register 300 to indicate a relative time spent in each operating state. In another embodiment, the count is not stored, and the count is used to calculate a partial power consumption estimate by shift register 306.

Shift register 306 may calculate a partial power consumption estimate by multiplying the elapsed time/count by the power consumption rate associated with the component or group of components after a change in state has occurred, in association with the previous operating state. The partial power consumption estimate may then be stored in accumulator 308, which adds each estimated power consumption estimate to a sum of previous estimated power consumption estimates to form an overall power consumption of electronic device 100. The result may be provided to processor 102 to report either the overall power consumption or for processor 102 to calculate an estimated remaining battery life of electronic device 100 by subtracting the overall power consumption from a total capacity of battery 110.

Figure 4A:
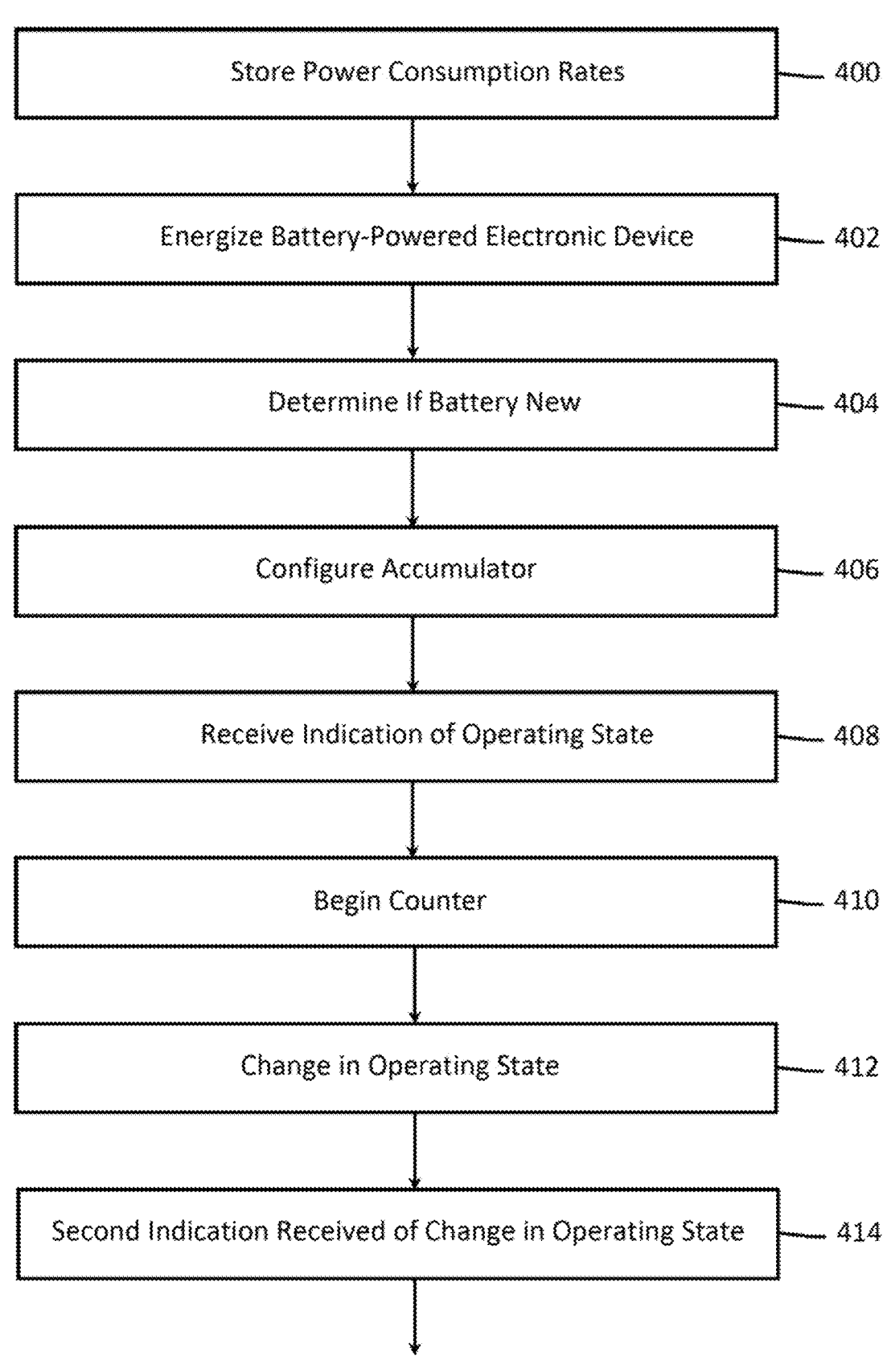
Figure 4C:
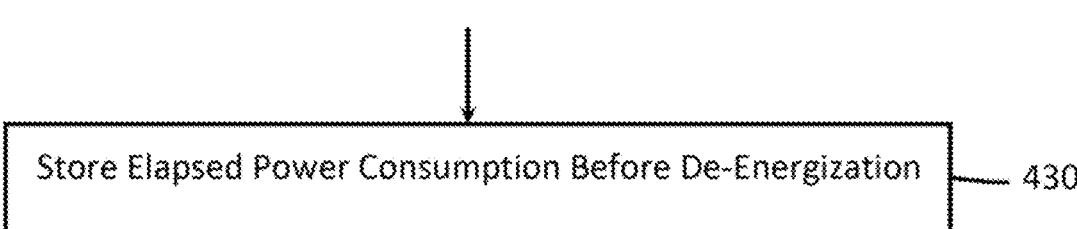

FIGS. 4A-4C represent a flow diagram illustrating one embodiment of a method for estimating a remaining battery life of a battery in an electronic device (or, conversely, estimating an elapsed power consumption of an electronic device and/or one or more active components thereof). For purposes of discussion, electronic device 100 comprises a battery-powered, wireless, reed switch-based security door/ window sensor. Reference is made to the previous example as shown and described with respect to FIG. 2, where the power consumption of two individual components, namely processor 102 and transceiver 108, are tracked over time, as well as the remaining circuitry of electronic device 100. In addition, in this embodiment, partial power consumption estimates are triggered when there is a change in state of either processor 102 or transceiver 108, and when this occurs, a partial power consumption estimate is calculated for processor 102, transceiver 108 and the remaining circuitry. It should be understood that in some embodiments, not all of the method steps shown in FIGS. 4A-4C are performed and that the order in which the steps are performed may be different in other embodiments.

At step 400, one or more power consumption rates are stored either in memory 104 or register 300, each power consumption rate associated with a particular component or group of components and, in some cases, an operating state of the particular component or group of components. The power consumption rates may be based on actual power consumption rates as measured during product development, by analyzing component data sheets that indicate typical power consumption, or as determined by processor 102 during use of electronic device 100. In this example, the power consumption rates as described with respect to FIG. 2 are stored.

At step 402, electronic device 100 is turned on.

At step 404, in one embodiment, processor 102 may determine if battery 110 is new or not, by reading the voltage of battery 110 and comparing the voltage to a predetermined threshold voltage. New batteries typically have a slightly higher voltage than used batteries, so if the voltage is above, for example, 99% of a typical new battery voltage, processor 102 may determine that battery 110 is relatively new and therefore have an actual power capacity of a new battery. In the present example, battery 110 comprises a CR2032 coin cell battery with a power capacity of 200 mAh.

In another embodiment, processor 102 may determine whether battery 110 is new or not by reading an accumulator value stored in memory 104. In this embodiment, when electronic device 100 is turned off, the value of accumulator 308 is stored in a non-volatile portion of memory 104. When processor 102 determines that a non-zero value is stored in memory 104, this indicates that the battery is used. When processor 102 determines that the stored accumulator value is zero, this indicates that the battery is new.

At step 406, in some embodiments, after determining whether battery 110 is new or not, processor 102 may configure accumulator 308. When processor 102 has determined that battery 110 is new, processor 102 may set the value of accumulator 308 to 0. When processor 102 has determined that battery 110 is not new, processor 102 load accumulator 308 with the accumulator value stored in memory 104.

At step 408, in one embodiment, PCMC 112 may receive a first indication of a current operating state of either processor 102 or transceiver 108. The first indication may represent a current operating state immediately following energization of the electronic device 100. The first indication may originate from a hardware output of either component, such as an interrupt, or from processor 102 executing processor-executable instructions that causes processor 102 to notify PCMC 112 of the current state of processor 102 and transceiver 108 and, in some embodiments, an identification of which component changed state. In the current example, it is assumed that the first indication indicates that processor 102 is in a quiescent state.

At step 410, in one embodiment, in response to receiving the first indication, counter 302 may begin counting based on a frequency of a clock that supplies a periodic waveform to counter 302, as is well-known in the art. In another embodiment, a start time is stored in register 300 in association with a time when the first indication was generated or received by PCMC 112.

At step 412, at some time later, processor 102 may enter an active state of operation. As part of entering the active state, processor 102 may provide a second indication to PCMC 112 that processor 102 has changed operating states, in this case, from the quiescent state to the active state.

At step 414, the second indication is received by PCMC 112.

At step 416, in response to receiving the second indication, an elapsed time is calculated. In one embodiment, counter 302 stops counting, and the count may be stored in register 300. The count represents an elapsed time that processor 102 spent in a previous operating state just before the change in state indicated by the second indication, in this case, the quiescent state. In another embodiment where a start time was stored in register 300, an end time may be determined as the time when the second indication was received, and an elapsed time may be calculated based on the end time minus the start time. The end time may then be stored in register 300 as a new start time of the current operating state of processor 102.

At step 418, after determining the elapsed time that processor spent in the quiescent state, a first partial power consumption estimate may be determined by shift register 306 by multiplying the elapsed time by each of the power consumption rates of processor 102, transceiver 108 and the remaining circuitry, respectively, in each respective operating state. In the current example, the elapsed time is 2 minutes, and the power consumption rate for processor 102 in the active state is 90, the power consumption rate for transceiver 108 in the quiescent state is 50, and the power consumption rate for the remaining circuitry is a constant 12 μAh. Thus, the first partial power consumption estimate is 0.8 μA.

At step 420, counter 302 may be cleared or reset in order to begin estimating a next elapsed time during a next operating state. In another embodiment, where a single component is monitored for power consumption, or battery-powered electronic device 100 as a whole, operating in only 2 states (active and quiescent), counter 302 stops counting and is not cleared, retaining its count, at the start of the component/device 100 enters into the quiescent state. Then, when the component/device 100 enters into the active state, the counter is enabled once again, and adds to its count during the active state. In this way, accumulator 308 is not needed, as counter 302 maintains an indication of the total elapsed time when the component/device 100 has been operating in the active state.

At step 422, the method of steps 410 through 420 are repeated each time that processor 102 or transceiver 108 changes state, with accumulator 308 adding each partial power consumption estimate to the previous total stored by accumulator 308 to provide an elapsed power consumption of battery-powered electronic device 100.

At step 424, at any point, processor 102 may retrieve the elapsed power consumption of battery-powered electronic device 100 as stored by accumulator 308 for calculating an estimated remaining battery life of battery 110, or to provide an elapsed power consumption of processor 102, transceiver 104 and/or the remaining circuitry to an engineer for development and/or troubleshooting purposes.

At step 426, processor 102 may calculate the remaining battery life of battery 110 by subtracting the battery capacity of battery 110 as stored in memory 104 or register 300 by the elapsed power consumption. Processor 102 may then provide the remaining battery life to a user of electronic device 100 via a user interface (not shown) or transmit the remaining battery life via transceiver 108. Alternatively, or in addition, processor and want to make calculate the remaining battery life of battery 110 as a percentage, dividing the elapsed power consumption by the battery capacity.

At step 428, in one embodiment, a sliding window of time may be used to estimate the power consumption rate of electronic device 100 over a given period of time which could aid development of electronic device 100 or reported to a user to know if battery-power electronic device 100 is using more or less power than expected. For example, a time window may be defined as being 30 seconds long, and as time progresses, the operating state of processor 102, transceiver 108 and the remaining circuitry, along with their respective power consumption rates in each operating state, may be used to determine the power consumption of electronic device 100 during the rolling 30 second time window, updated periodically, such as once per second, once every 30 seconds, etc. Processor 102 may be configured to conduct this rolling, power consumption rate, based on the processor-executable instructions stored in memory 104, or PCMC may be configured to do so in hardware.

At step 430, processor 102 may retrieve the elapsed power consumption of electronic device 100 from accumulator 308 prior to de-energization of electronic device 100 and store the value in memory 104 where at least a portion of memory 104 is non-volatile, for use during later energization to load accumulator 308 with the elapsed power consumption.

Figure 5A:
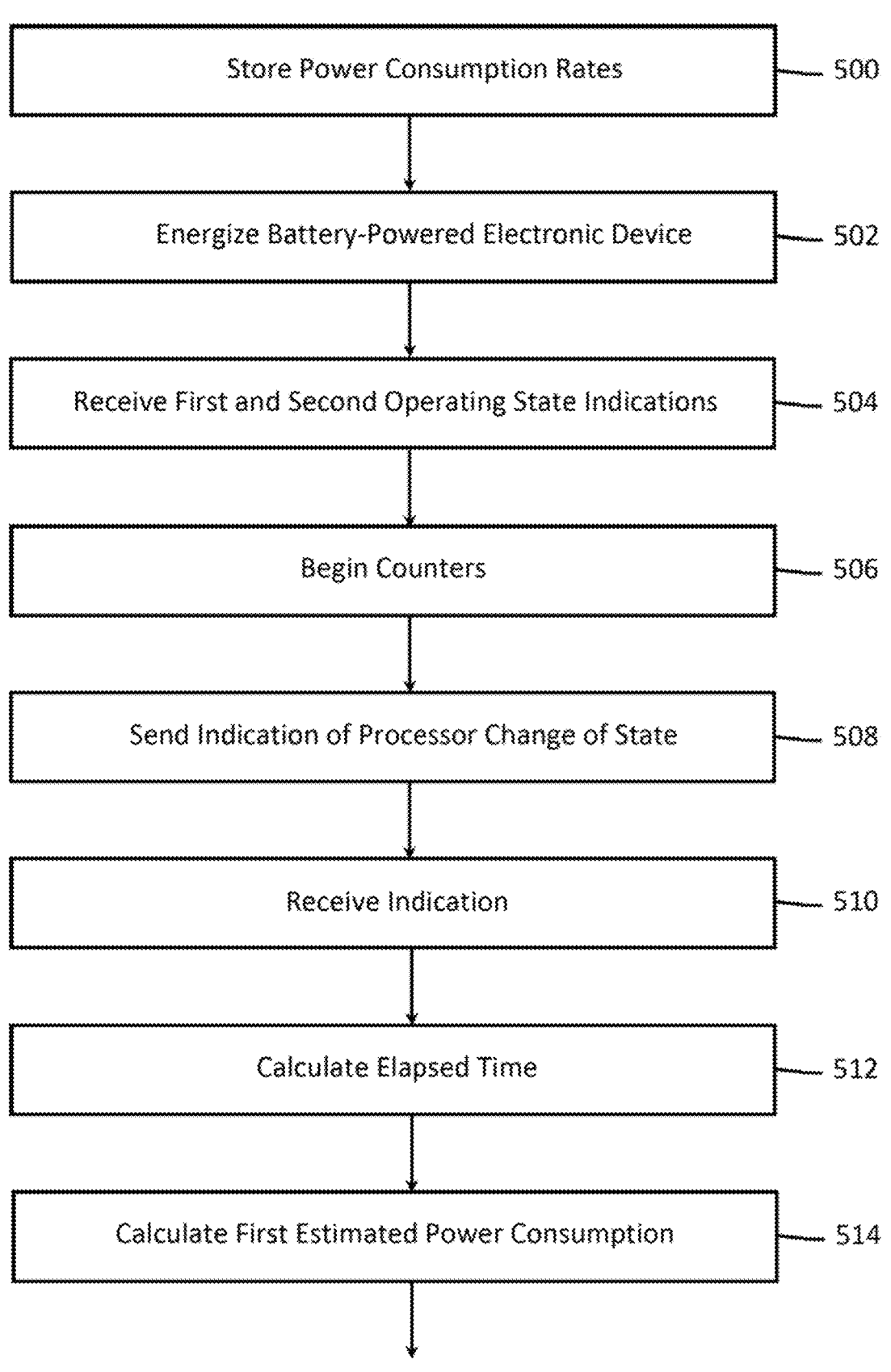
FIGS. 5A-5C represent a flow diagram illustrating another embodiment of a method for estimating a remaining battery life of the battery in the electronic device of FIG. 1 (or, conversely, estimating an elapsed power consumption of the electronic device)
Figure 5B:
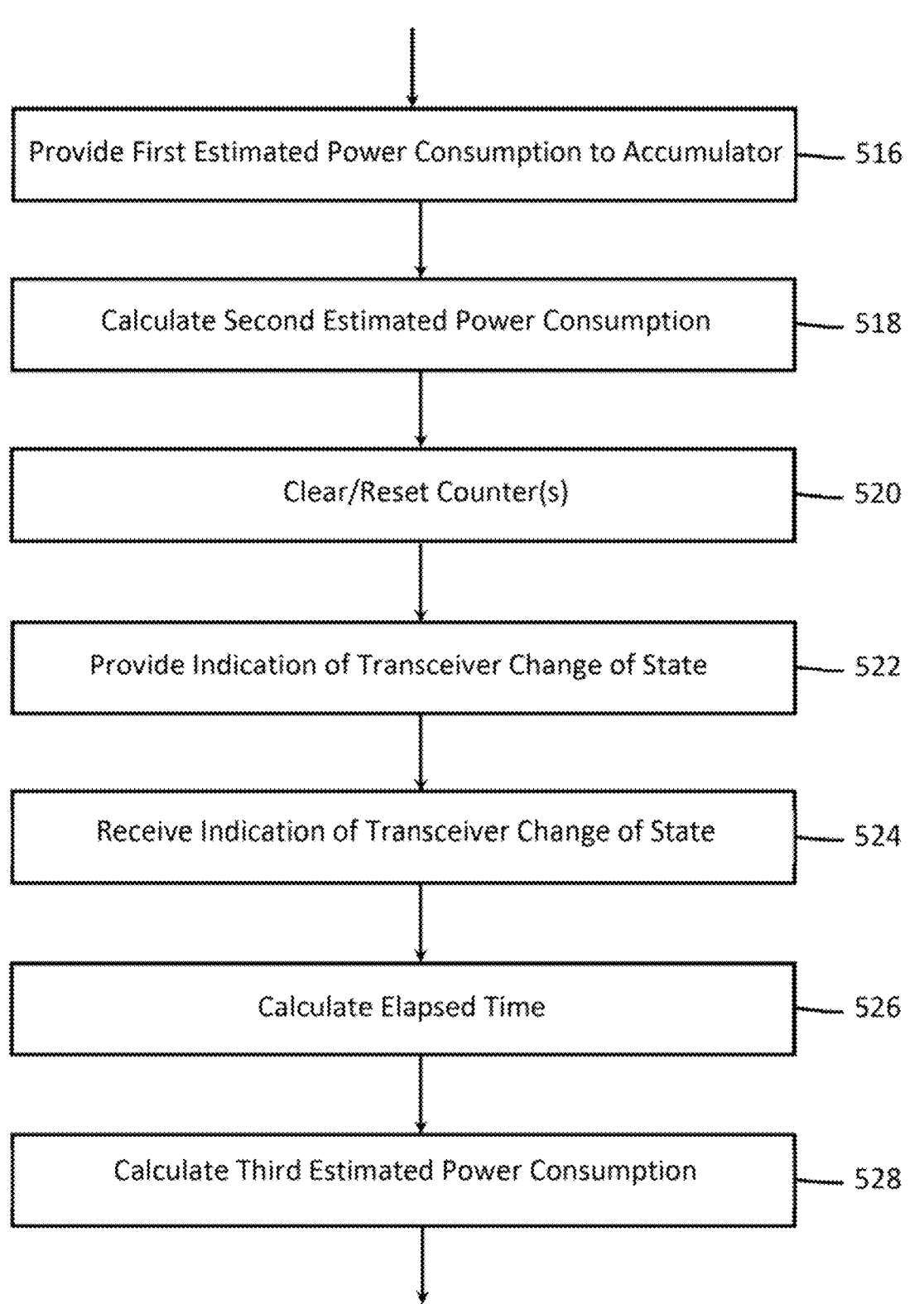
Figure 5C:
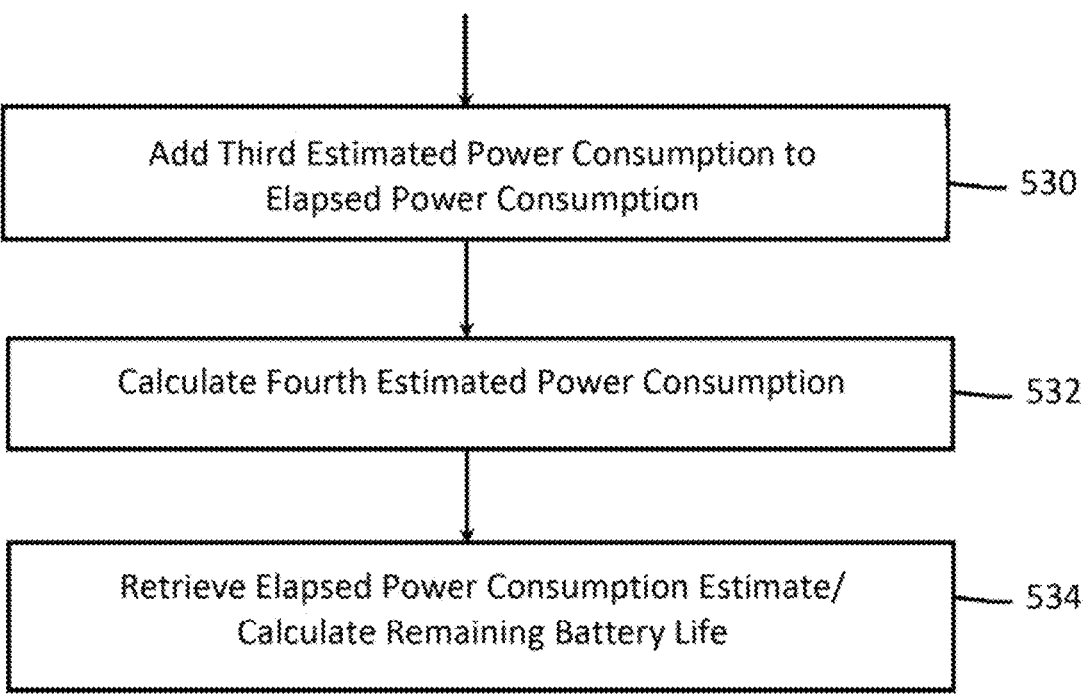
Figure 6:
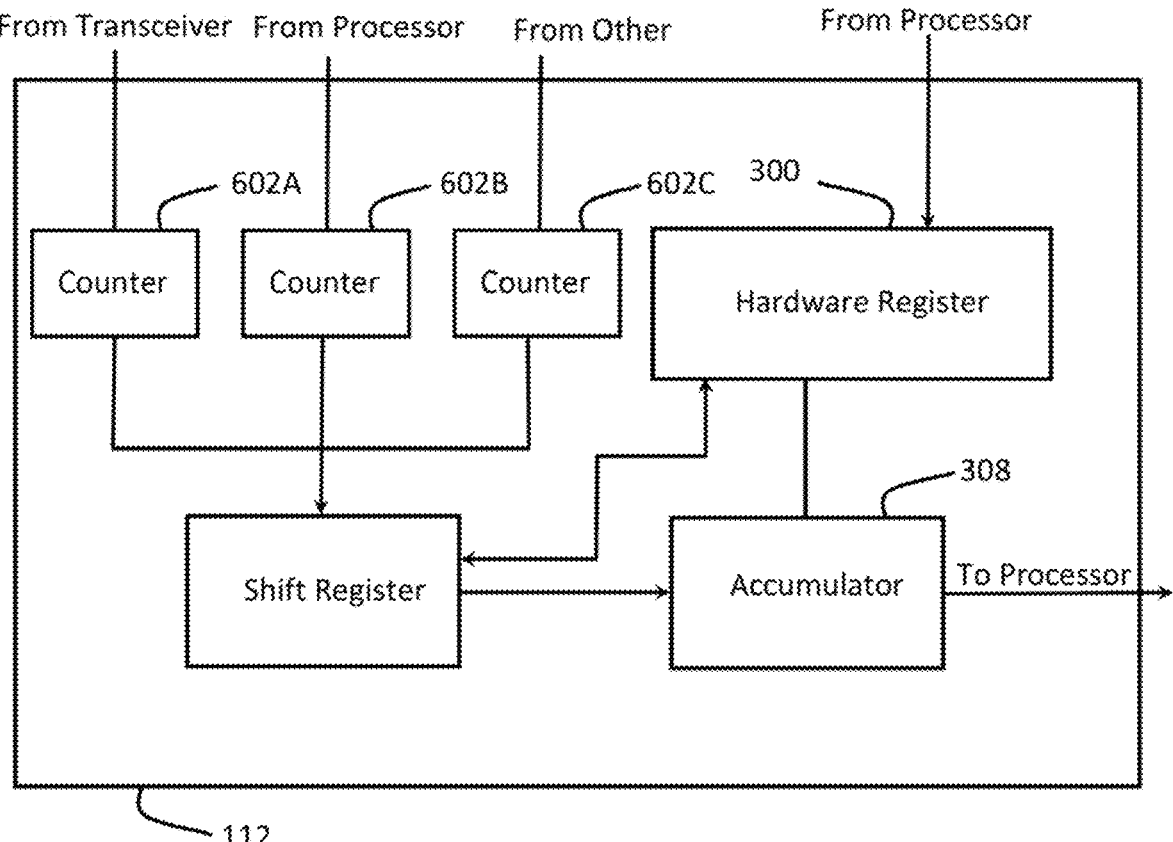
FIG. 6 is a simplified block diagram of another embodiment of the power consumption measurement circuitry as shown in FIG. 3.

FIGS. 5A-5C represent a flow diagram illustrating another embodiment of a method for estimating a remaining battery life of a battery in an electronic device (or, conversely, estimating an elapsed power consumption of an electronic device and/or one or more active components thereof). Reference is made to FIG. 6, which is a simplified block diagram of another embodiment of PCMC 112. Reference is also made to the previous example as shown and described with respect to FIG. 2 and the method of FIG. 4 where the power consumption of two individual components, namely processor 102 and transceiver 108, are tracked over time, as well as the remaining circuitry of electronic device 100. However, in this embodiment, partial power consumption estimates are tracked separately for one or more active electronic components of electronic device 100, in this example, processor 102, transceiver 108 and the remaining circuitry. It should be understood that in some embodiments, not all of the method steps shown in FIGS. 5A-5C are performed and that the order in which the steps are performed may be different in other embodiments.

At step 500, one or more power consumption rates are stored either in memory 104 or register 300, each power consumption rate associated with a particular component or group of components and, in some cases, an operating state of the particular component or group of components. In this example, the power consumption rates as described with respect to FIG. 2 are stored.

At step 502, electronic device 100 is energized, or powered on.

At step 504, in one embodiment, PCMC 112 may receive a first indication of a current operating state of processor 102 and a second indication of a current operating state of transceiver 108. The first and second indications may represent a current operating state of each respective component immediately following energization of electronic device 100. The first indication may originate from a hardware output of either component, such as an interrupt, or from processor 102 executing processor-executable instructions that causes processor 102 to notify PCMC 112 of the current state of both processor 102 and transceiver 108. In the current example, it is assumed that the first indication indicates that processor 102 is in a quiescent state and that the second indication indicates that transceiver 108 is also in a quiescent state.

At step 506, in one embodiment, in response to receiving the first and second indications, counters 602a, 602b and 602c shown in FIG. 6 may begin counting based on a frequency of a clock that supplies a periodic waveform to the counters. In another embodiment, a start time of each counter is stored in register 300 in association with a time when the first and second indication were generated or received by PCMC 112.

At step 508, at some time later, processor 102 may enter an active state of operation, while transceiver 108 remains in the quiescent state. As part of entering the active state, processor 102 may provide a third indication to PCMC 112 indicating that processor 102 has changed operating state, in this case, from the quiescent state to the active state.

At step 510, the third indication is received by PCMC 112.

At step 512, in response to receiving the third indication, an elapsed time is calculated for processor 102. In one embodiment, counter 602a stops counting, and its count may be stored in register 300. Counters 602b and 602c typically continue counting. The count from counter 602a represents an elapsed time that processor 102 spent in a previous operating state just before the change in state indicated by the third indication, in this case, the quiescent state. In another embodiment where a start time associated with counter 602a was stored in register 300, an end time of counter 602a may be determined as the time when the third indication was received, and an elapsed time may be calculated for processor 102 based on the end time minus the start time of counter 602a. The end time may then be stored in register 300 as a new start time of counter 602a, tracking the time spent by processor 102 in the active state.

At step 514, after determining the elapsed time that processor 102 spent in the quiescent state, a first partial power consumption estimate may be determined by shift register 306 by multiplying the elapsed time by the power consumption rate of processor 102 while in the quiescent state. In the current example, the elapsed time is 2 minutes, and the power consumption rate for processor 102 in the quiescent state is 10 μAh. Thus, the first partial power consumption estimate is 0.33 μA.

At step 516, the first partial power consumption estimate is provided to accumulator 308, which adds the first partial power consumption estimate to an elapsed power consumption estimate stored by accumulator 308.

At step 518, in one embodiment, a second partial power consumption estimate may be calculated for the remaining circuitry at the time the third indication is received, when the remaining circuitry is assigned a power consumption rate that does not significantly change over time. In this example, the power consumption rate of the remaining circuitry is 12 μAh, resulting in a second partial power consumption estimate of 0.4 μA over the 2 minutes that processor 102 was in the quiescent state. The second partial power consumption estimate may then be provided to accumulator 308, which adds the second partial power consumption estimate to the elapsed power consumption estimate stored by accumulator 308, including the second partial power consumption estimate.

At step 520, each of the counters may be cleared or reset in order to begin estimating a next elapsed time that each component spends in a next operating state. In another embodiment, where a single component is monitored for power consumption, or battery-powered electronic device 100 as a whole, operating in only 2 states (active and quiescent), each counter stops counting and is not cleared, retaining its count, at the start of when a respective, monitored component enters into the quiescent state. Then, when a respective component enters into the active state, the associated counter is enabled once again, and adds to its count during the active state of the respective component. In this way, accumulator 308 is not needed, as the counters maintain an indication of the total elapsed time of each respective component in the active state.

At step 522, at some time later, transceiver 108 may enter an active state of operation while processor 102 remains in the active state. As part of entering the active state, transceiver 108 may provide a fourth indication to PCMC 112, indicating that transceiver 108 has changed operating state, in this case, from the quiescent state to the active state.

At step 524, the fourth indication is received by PCMC 112.

At step 526, in response to receiving the fourth indication, an elapsed time is calculated for transceiver 108. In one embodiment, counter 602b stops counting, and its count may be stored in register 300. Counters 602a and 602c typically continue counting. The count from counter 602b represents an elapsed time that transceiver 108 spent in a previous operating state just before the change in state indicated by the fourth indication, in this case, the quiescent state. In another embodiment where a start time associated with counter 602b was stored in register 300, an end time of counter 602b may be determined as the time when the fourth indication was received, and an elapsed time may be calculated for transceiver 108 based on the end time minus the start time of counter 602b. The end time may then be stored in register 300 as a new start time of counter 602b, tracking the time spent by transceiver in the active state.

At step 528, after determining the elapsed time that transceiver 108 spent in the quiescent state, a third partial power consumption estimate may be determined by shift register 306 by multiplying the elapsed time by the power consumption rate of transceiver 108 while in the quiescent state. In the current example, the elapsed time is 2 minutes and 20 seconds, and the power consumption rate for transceiver 108 in the quiescent state is 2 μAh. Thus, the third partial power consumption estimate is 0.78 μA.

At step 530, the third partial power consumption estimate is provided to accumulator 308, which adds the third partial power consumption estimate to the elapsed power consumption estimate stored by accumulator 308.

At step 532, as previously discussed, in one embodiment, a fourth partial power consumption estimate may be calculated for the remaining circuitry at the time the fourth indication is received, when the remaining circuitry is assigned a power consumption rate that does not significantly change over time. In this example, the power consumption rate of the remaining circuitry is 12 μAh, resulting in a fourth partial power consumption estimate of 0.67 μA over the 2 minutes and 20 seconds that transceiver was in the quiescent state. In an embodiment where counter 608c was cleared after calculating the second partial power consumption estimate, the fourth partial power consumption estimate is based on the elapsed time that transceiver 108 spent in the quiescent state after processor 102 entered the active state. In any case, the fourth partial power consumption estimate may then be provided to accumulator 308, which adds the fourth partial power consumption estimate to the elapsed power consumption estimate stored by accumulator 308, including the first and third partial power consumption estimates or the first, second, third and fourth partial power consumption estimates.

At step 534, at any point, processor 102 may retrieve the elapsed power consumption of electronic device 100 as stored by accumulator 308 for presenting the elapsed power consumption of electronic device 100 and/or for calculating an estimated remaining battery life of battery 110, as explained earlier herein, using the elapsed power consumption stored by accumulator 308. Alternatively, or additionally, processor 102 may retrieve the counter values of each of the counters to derive an elapsed power consumption of processor 102, transceiver 104 and/or the remaining circuitry, and to provide the elapsed power consumption(s) to an engineer for development and/or troubleshooting purposes.

Figure 7:
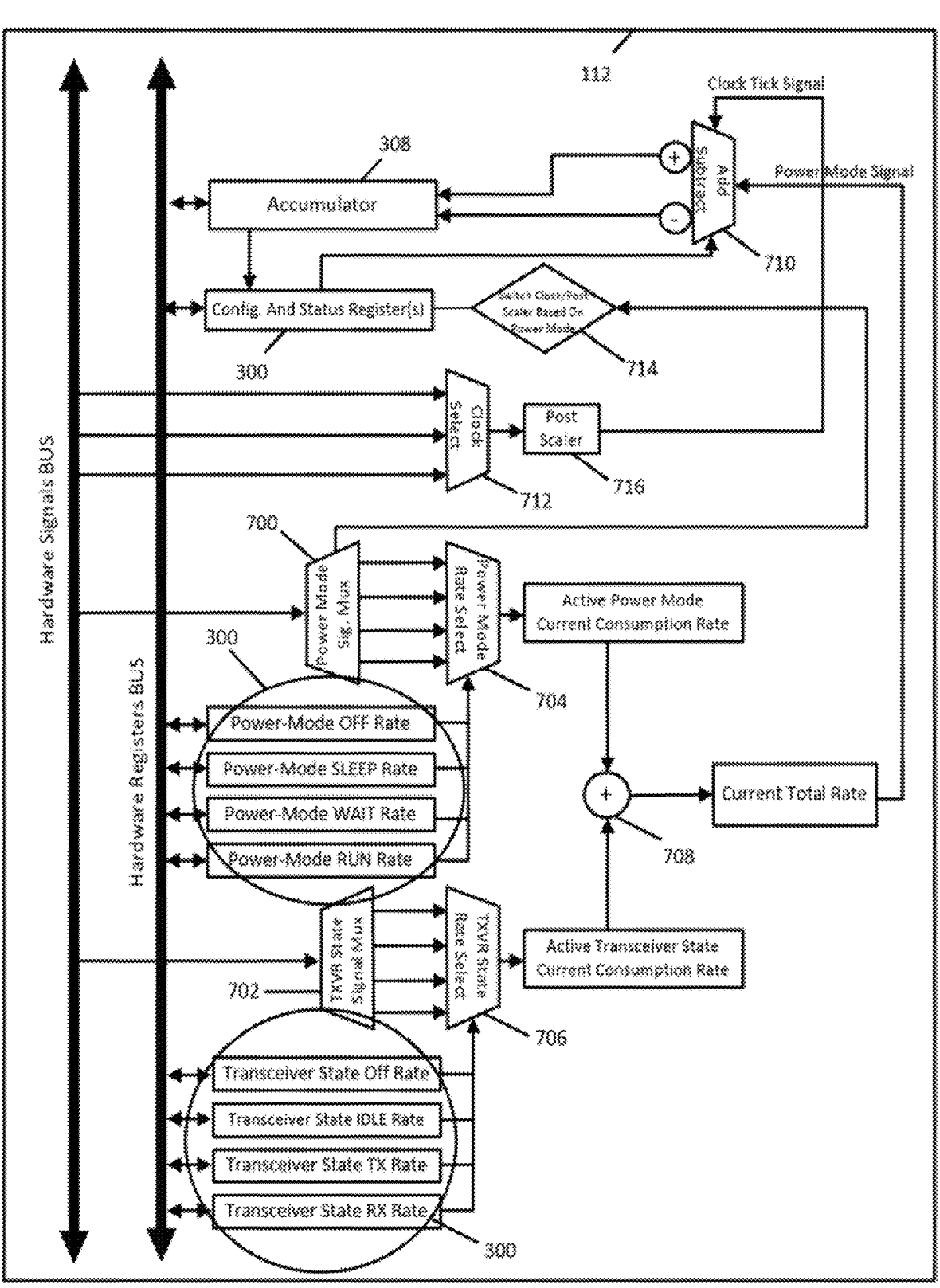
FIG. 7 is a simplified block diagram of yet another embodiment of the power consumption measurement circuitry as shown in FIG. 3.

FIG. 7 is a functional block diagram of another embodiment of PCMC 112. In this embodiment, a plurality of power consumption rates of two active electronic components, or group of components, are used to calculated a continuous estimated power consumption of electronic device 100 and/or one or more active components thereof over time as each active component operates in a number of operating states. All of the components shown in FIG. 7 comprise digital logic gates, digital counters, digital storage registers, etc. which are well known in the art. In this embodiment, processor 102 (not shown in FIG. 7) provides operating state information to a operating state multiplexer 700, comprising an indication of a particular operating state of processor 102. In this example, the possible operating states of processor 102 are off, sleep (quiescent), wait, and run. A power consumption rate for processor 102 is stored in association with each operating state of processor 102, respectively, in hardware register 300. Similarly, transceiver 108 (not shown) provides operating state information to a operating state multiplexer 702, comprising an indication of a particular operating state of transceiver 108 (not shown). In this example, the possible operating states of transceiver 108 are off, idle (quiescent), transmit, and receive. A power consumption rate for transceiver 108 is stored in association with each operating state of transceiver, respectively, in hardware register 300.

As electronic device 100 operates, processor 102 provides indications to multiplexer 700, indicating a particular operating state of processor 102. Similarly, and separately, transceiver 108 also provides indications of its operating state to multiplexer 702. Rate selector 704 is used to select a current operating mode of processor 102, retrieve an associated power consumption rate associated with the current operating mode of processor 102 from register 300, and provide the power consumption rate to adder 708. Similarly, rate selector 706 is used to select a current operating mode of transceiver 108, retrieve an associated power consumption rate associated with the current operating mode of transceiver 108 from register 300, and provide the power consumption rate to adder 708. This, as time goes on, adder 708 is supplied with a power consumption rate of each of processor 102 and transceiver 108 associated with a current operating state of each component.

Adder 708 adds the power consumption rate associated with processor 102 and the power consumption rate associated with transceiver 108, producing a total power consumption rate of processor 102 and transceiver 108. Course, in other embodiments where three or more active components are monitored to determine their power consumption over time, adder 708 is provided with additional power consumption rates associated with additional active electronic components and adds them to the power consumption rates of processor 102 and transceiver 108.

The combined power consumption rate of processor 102 and transceiver 108 is provided to add/subtract circuitry 710, where it is provided to accumulator 308, either as an additive signal or a subtraction signal, depending on whether accumulator 308 is used to determine an elapsed power consumption (additive) or whether accumulator 308 is used to determine a remaining battery life of battery 110. For this subtraction mode, processor 102 may load accumulator 308 with a battery capacity of battery 110 when fully charged, and as time goes on, accumulator 308 reduces the battery capacity depending on the power draw of both processor 102 and transceiver 108, depending on the length of time that each component spends in each operating state.

The combined power consumption rate of processor 102 and transceiver 108 is provided to accumulator through a via add/subtract circuitry 710, which increases a count of accumulator 308 at a predetermined rate in accordance with a clock tick signal from scaler 112 having a predetermined frequency. Upon each clock tick signal, accumulator 308 is incremented or decremented an amount equal to the combined power consumption rate provided by adder 708.

In some embodiments, the clock tick signal is simply a digital waveform with a fixed frequency. In other embodiments, as shown in FIG. 7, a clock selection circuitry 714 uses an indication from operating state multiplexer 700 of the current power consumption state of processor 102 to select a clock signal via clock multiplexer 716 from a plurality of available clock signals, in this example, a low-power clock, a first system clock and a second system clock. The low-power clock provides a simple clock signal, typically from a crystal oscillator, at a relatively low frequency of, for example, 100 hz or less, typically used in a low-power state of operation. The first system clock is a clock signal provided by processor 102 at a relative high frequency of, for example, 10 kHz, typically used in "medium" state of operation, such as an idle state. The second system clock may also be provided by processor 102, comprising a clock with a frequency of 50 kHz, typically used in a high-power state of operation, such as the run state, transmit state, etc. Clock selection circuitry 714 uses the indication of the current operating state of processor 102 to select one of the clocks for use by add/subtract circuitry 710, and then scales the selected signal using post scaler 716 to achieve a fixed clock signal for use by add/subtract circuitry 710. For example, when processor 102 is operating in the run state, clock selection circuitry 714 may be configured to select the system clock and post scaler 716 is used to scale the system clock (i.e., reduce the system clock frequency) to achieve a clock tick signal at a predetermined frequency. When processor 102 is operating in the off or sleep state, clock selection circuitry 714 may be configured to select the low-power clock and post scaler 716 scales the low-power clock to match the predetermined frequency (i.e., by reducing the low-power clock frequency to the predetermined frequency).

In another embodiment, the clock tick signal is variable, depending on an operating state of a component, group of components or electronic device 100 as a whole, and a particular clock used during a particular operating state. For example, the clock tick signal may comprise a frequency of 1 Hz while transceiver 108 is in an idle state, 10 kHz when transceiver 108 is in a receive state and 50 kHz when transceiver 108 is in the transmit state. A plurality of "scaled" power consumption rates are stored in register 300 for each component, group of components or electronic device 100 being monitored for each operating state and for each potential clock signal used. For example, processor 102 may have three scaled power consumption rate stored in register 300 associated with the run state, one for use with the low-power clock, one for use with the first system clock and one for use with the second system clock. Depending on which clock is being used for each operating state, the clock tick signal may vary in frequency and the scaled power consumption rate is changed proportionally, in some embodiments, by clock selection circuitry 714 setting scaler 112 to multiple or divide a clock signal to achieve a desired clock tick signal frequency. Further details of this embodiment are provided in the description associated with the method of FIG. 8, below.

Configuration/status register 718 is a hardware register that stores information relating to how clock selection circuitry 714 selects particular clock signals during each operating state of processor 102, stores a particular count direction for use by add/subtract circuitry 710, stores a power capacity of battery 110, and may store an indication when the estimated power consumption has reached a predetermined threshold, i.e., a threshold approximately equal to the capacity of battery 100, indicating that battery 100 is nearly or completely exhausted; or zero, in the case where the power capacity of 110 is loaded into accumulator 308 and reduced over time as power is consumed.

Figure 8A:
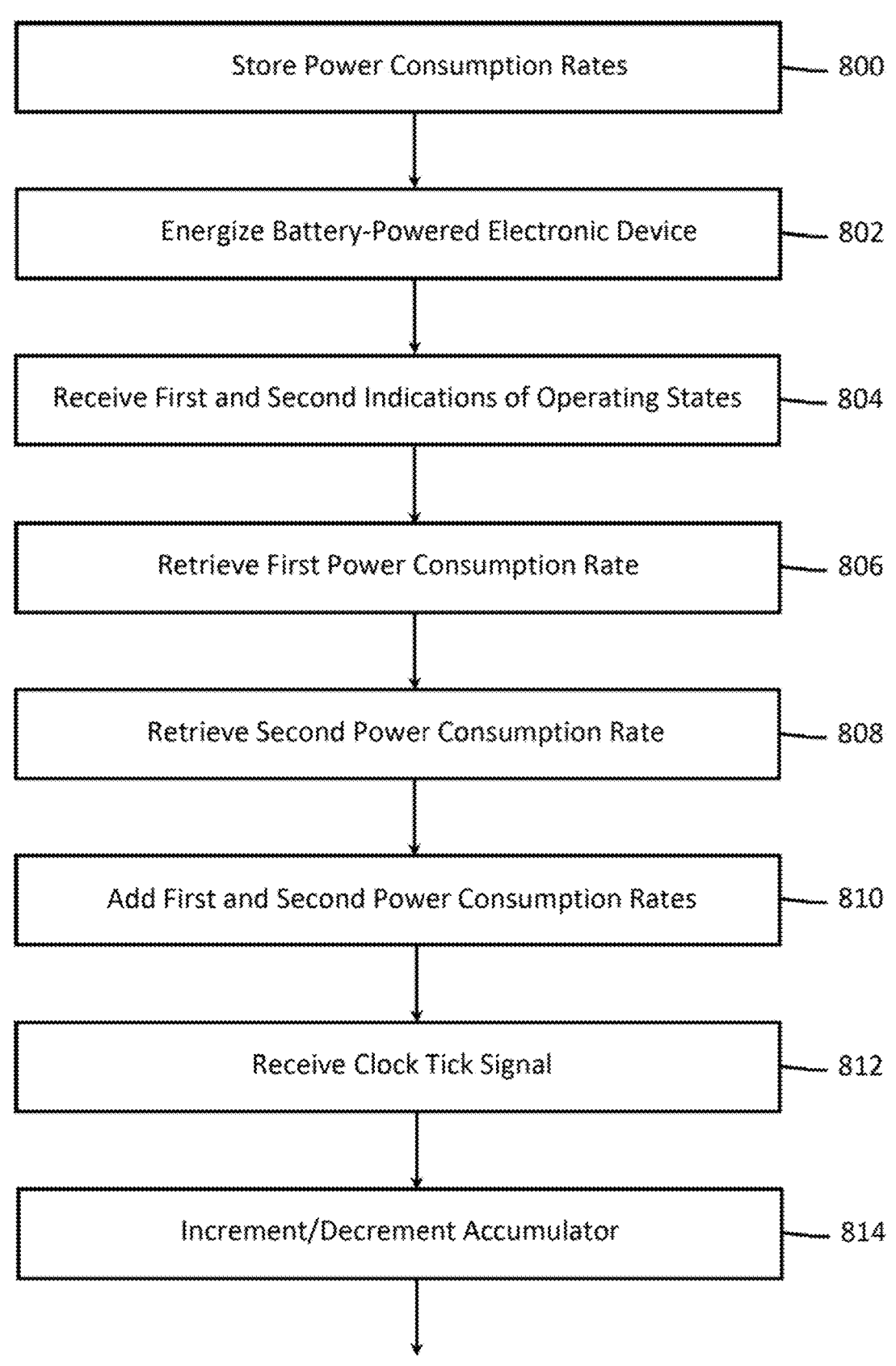
FIGS. 8A-8B represent a flow diagram illustrating another embodiment of a method for estimating a remaining battery life of the battery in an electronic device of FIG. 1 (or, conversely, estimating an elapsed power consumption of an electronic device).
Figure 8B:
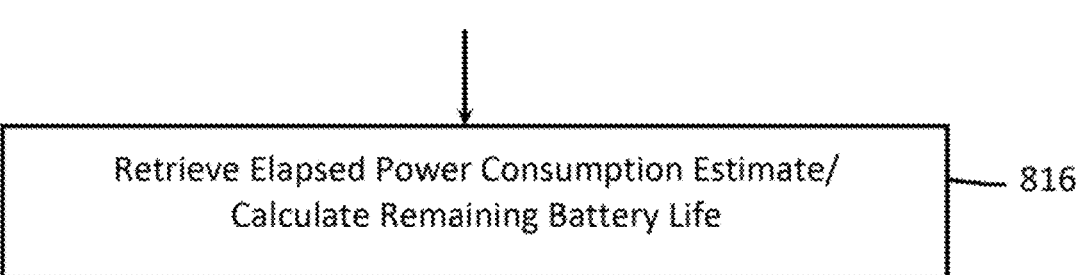

FIGS. 8A-8B represent a flow diagram illustrating another embodiment of a method for estimating the elapsed power consumption of an electronic device and/or one or more components thereof (or estimating the remaining battery life of a battery in an electronic device). Reference is made to FIG. 7, which is a simplified block diagram of another embodiment of PCMC 112. In this embodiment, a power consumption rate of each of processor 102 and transceiver 108 is added together and the combined power consumption rate used to increment, or decrement, an accumulator. It should be understood that in some embodiments, not all of the method steps shown in FIGS. 8A-8B are performed and that the order in which the steps are performed may be different in other embodiments.

At step 800, one or more power consumption rates are stored in register 300, each power consumption rate associated with a particular operating state of one or more components or group of components and, in some cases, an operating state of electronic device 100 is stored in hardware register 300. In this example, the operating states and power consumption rates of processor 102 and transceiver 108 are as follows:

Processor
    Off—0 µAh—No current/power consumption
    Sleep—8 µAh—Quiescent state.
    Wait—30 µAh—A time that processor 102 waits to receive a response from another component after sending a query
    Run—50 µAh—Processor 102 is fully activated
Transceiver
    Off—0 µAh—No current/power consumption
    Idle—12 µAh—Quiescent state, waiting to transmit or receive.
    Transmit—80 µAh—Time when transceiver 108 is actively transmitting
    Receive—30 µAh—Time when transceiver 108 is actively receiving At step 802, electronic device 100 is energized, or powered on.

At step 804, in one embodiment, PCMC 112 may receive a first indication of a current operating state of processor 102 and a second indication of a current operating state of transceiver 108. The first and second indications may represent a current operating state of each respective component immediately following energization of electronic device 100. The first indication may originate from a hardware output of either component, such as an interrupt, or from processor 102 executing processor-executable instructions that causes processor 102 to notify PCMC 112 of the current state of both processor 102 and transceiver 108. In the current example, it is assumed that the first indication indicates that processor 102 is in the sleep state and that the second indication indicates that transceiver 108 is in the idle state. In one embodiment, the indication from processor 102 is received by multiplexer 700 and the indication from transceiver 108 is received by multiplexer 702.

At step 806, in response to receiving the first indication from processor 102, rate selector 704 retrieves a power consumption rate from register 300 in association with the current operating state of processor 102, in this case, a power consumption rate associated with processor 102 in the sleep state=8 µAh, and provides it to adder 708.

At step 808, in response to receiving the second indication from transceiver 108, rate selector 706 retrieves a power consumption rate from register 300 in association with the current operating state of transceiver 108, in this case, a power consumption rate associated with transceiver 108 in the idle state=12 µAh and provides it to adder 708.

At step 810, adder 708 adds the current power consumption rate of processor 102 to the current power consumption rate of transceiver 108 and provides a combined power consumption rate to add/subtract circuitry 710, typically comprising one or more logic gates and counters.

At step 812, a clock tick signal, comprising a periodic waveform at a particular frequency, such as 10 kHz, is provided to add/subtract circuitry 710 by one of a plurality of system clocks of electronic device 100. In another embodiment, the clock tick signal is derived from one of two or more clocks provided to a multiplexer 712. In the example of FIG. 7, one of three clocks are selectable by logic switch 714: a low-power clock at 1 hz, a first system clock at 10 kHz, and a second system clock at 50 kHz. Logic switch 714 receives an indication of a current operating state of processor 102 from multiplexer 700 which is used to select one of the three available clocks via multiplexer 712. Logic switch 714 retrieves pre-stored clock selection information stored in register 300 and uses this information to cause multiplexer 712 to select one of the clocks and to cause post scaler 716 to scale the selected clock signal to a desired frequency for use by add/subtract circuitry 710. For example, if the desired frequency for use by add/subtract circuitry 710 is 10 khz, and the current operating state of processor 102 is sleep, logic switch may retrieve clock selection information from register 300 that causes multiplexer 712 to select the low-power clock, as the first system clock and second system clock may not be available when processor 102 is in the sleep state. Logic switch 714 further causes post scaler 716 to scale, i.e., divide or multiply, the selected clock signal to the desired frequency of 10 khz, in this case, by multiplying the low-power clock signal by 10,000 using a logic multiplication circuit. The resulting 10 khz clock tick signal is then provided to add/subtract circuitry 710 as the clock tick signal.

When processor 102 changes state to the run state, logic switch may retrieve clock selection information from register 300 that causes multiplexer 712 to select the first system clock, for example. Logic switch 714 then may cause post scaler 716 to scale, or divide, the selected system clock signal to the desired frequency of 10 khz, in this case, by neither dividing nor multiplying the first system clock signal, as the first system clock signal is equal to the desired clock tick signal of 10 kHz. The resulting 10 khz clock tick signal is then provided to add/subtract circuitry 710. Similarly, the second system clock may be selected when processor 102 is in, for example, the wait state, and post scaler 714 configured to divide the second system clock by a predetermined amount, in this case, by 5 to achieve the desired clock tick signal of 10 kHz. Further, selection of a particular clock signal by logic switch 714 may be based on an operating state of a component other than processor 102, such as transceiver 108, some other component or group of components or electronic device 100 as a whole.

In another embodiment, the clock tick signal varies depending on which of the low-power clock, first system clock and second system clock is selected by the power mode signal. In this embodiment, each power consumption rate stored in register 300 for each monitored component of electronic device 100, in each state of operation of a particular component, is associated with a plurality of power consumption rates dependent upon which clock is being used to produce the clock tick signal.

For example, if processor 102 consumes 90 μAh in the run state, 30 μAh in the wait state and 10 μAh in the sleep state, 3 "scaled" power consumption rates may be stored in register 300 for processor 102 for when processor 102 is in the run state: a first scaled power consumption rate of 90 for use when the clock tick signal is derived from the first system clock running at 10 kHz, a second scaled power consumption rate of 30 may be stored in register 300 for use when the clock tick signal is derived from the second system clock running at 30 kHz and a third scaled power consumption rate of 9 may be stored in register 300 for use when the clock tick signal is derived from the third system clock running at 100 kHz. In other words, the scaled power consumption rates are inversely proportional to the frequency of each clock rate. Then, depending on which clock is being used, while processor 102 is in the run state, clock selection circuitry 714 retrieves a corresponding power consumption rate associated with the present clock being used for processor 102 in the run state. Similarly, multiple scaled power consumption rates may be stored in register 300 corresponding to the other states of processor 102, such as scaled power consumption rates associated with the wait and sleep states. The process of scaling the power consumption rates depending on which clock is used results in an accurate accumulation of power consumption for each component and electronic device 100 as a whole. Of course, each component, group of components or electronic device 100 as a whole may utilize a plurality of scaled power consumption rates as described above.

At step 814, add/subtract circuitry 710 increments or decrements accumulator 308 by the combined power consumption rate as the clock tick signal completes a period. Add/subtract circuitry 710 increments accumulator 308 when accumulator 308 is used to determine an elapsed power consumption of electronic device 100 and decrements accumulator 308 when accumulator 308 is used to determine a remaining battery life of battery 110. Add/subtract circuitry 710 determines whether to increment or decrement based on an add/subtract signal from register 300.

At step 816, the elapsed power consumption, or remaining battery life, may be read by processor 102, querying accumulator 308. If the elapsed power consumption is determined, it may be used to calculate the remaining battery power of battery 110 by subtracting it from the battery capacity of battery 110, as stored in memory 104.

Although specific advantages have been enumerated above, various embodiments may include some, none, or all of the enumerated advantages.

Other technical advantages may become readily apparent to One of ordinary skill in the art after review of the foregoing figures and description.

It should be understood at the outset that, although exemplary embodiments are illustrated in the figures described above, the principles of the present disclosure may be implemented using any number of techniques, whether currently known or not. The present disclosure should in no way be limited to the exemplary implementations and techniques illustrated in the drawings and described above.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. The article "a" means "one or more".

To aid the Patent Office and any readers of any patent issued on this application in interpreting the claims appended hereto, there is no intention that any of the appended claims or claim elements invoke 35 U.S.C. 112(f) unless the words "means for" or "step for" are explicitly used in the particular claim.

What is claimed is:

1. An electronic device, comprising:

a battery;

an active electronic component powered by the battery, operating in a plurality of operating states over time; and power consumption measurement circuitry, configured to determine an elapsed power consumption of the electronic device, the elapsed power consumption of the electronic device comprising a summation of a plurality of partial power consumption estimates associated with at least the active electronic component, each partial power consumption estimate comprising a power consumption rate associated with each of the plurality of operating states multiplied by an elapsed time spent in each of the plurality of operating states, respectively.

2. The electronic device of claim 1, wherein the power consumption measurement circuitry comprises:

a hardware register, configured to store a start time when the active electronic component changes from a first operating state to a second operating state, and to store a power consumption rate of each of the plurality of operating states associated with the active electronic component;

a counter configured to determine an elapsed time between the start time and an end time of the first operating state;

a shift register configured to multiply the elapsed time by a first power consumption rate associated with the first operating state to produce a first partial power consumption estimate; and an accumulator configured to add the first partial power consumption estimate to a previously-recorded elapsed power consumption of the active electronic component to produce the elapsed power consumption.

3. The electronic device of claim 2, wherein the accumulator is further configured to subtract the elapsed power consumption from the power capacity of the battery to produce a remaining life of the battery.

4. The electronic device of claim 2, further comprising:

a processor configured to read a voltage of the battery upon energization of the electronic device, compare the voltage to a predetermined threshold and when the voltage is higher than the predetermined threshold, set the accumulator to zero.

5. The electronic device of claim 1, further comprising:

a second active electronic component powered by the battery, operating in a plurality of second operating states over time;

wherein the elapsed power consumption further comprises a second summation of a plurality of partial power consumption estimates of the second active electronic component, each partial power consumption estimate comprising a power consumption rate associated with each of the plurality of second operating states multiplied by an elapsed time spent in each of the plurality of second operating states, respectively.

6. The electronic device of claim 5, wherein the plurality of operating states and the plurality of second operating states occur independently of each other.

7. The electronic device of claim 5, wherein the plurality of operating states and the plurality of second operating states comprise a plurality of operating states of the electronic device.

8. The electronic device of claim 5, wherein:

the hardware register is further configured to store a second start time when the second active electronic component changes from a first operating state of the plurality of second operating states to a second operating state of the plurality of second operating states, and to store a power consumption rate of each of the plurality of second operating states associated with the second active electronic component;

the counter is further configured to determine a second elapsed time between the second start time and a second end time of the first operating state of the plurality of second operating states;

the shift register is further configured to multiply the second elapsed time by a second power consumption rate associated with the first operating state to produce a second partial power consumption estimate; and the accumulator is further configured to add the second partial power consumption estimate to the elapsed power consumption of the electronic device to produce an updated, elapsed power consumption.

9. The electronic device of claim 1, further comprising:

a processor, configured to calculate a plurality of average power consumption rates of the electronic device over a predetermined, sliding time window; and a transceiver coupled to the processor, configured to transmit the plurality of average power consumption rates of the electronic device to a remote device.

10. The electronic device of claim 1, further comprising:

a processor, coupled to the transceiver and the power consumption measurement circuitry, configured to determine a remaining life of the battery as a difference between a power capacity of the battery minus the elapsed power consumption.

11. A method for determining an elapsed power consumption of an electronic device, comprising:

determining a plurality of partial power consumption estimates associated with a first active component of the electronic device, each partial power consumption estimate comprising a power consumption rate associated with the first active component in each of a plurality of operating states multiplied by an elapsed time spent in each of the plurality of operating states, respectively; and summing the plurality of partial power consumption estimates to produce the elapsed power consumption.

12. The method of claim 11, further comprising:

storing a start time when the active electronic component changes from a first operating state to a second operating state;

storing a power consumption rate of each of the plurality of operating states associated with the active electronic component;

determining an elapsed time between the start time and an end time of the first operating state;

multiplying the elapsed time by a first power consumption rate associated with the first operating state to produce a first partial power consumption estimate; and adding the first partial power consumption estimate to a previously-recorded elapsed power consumption of the active electronic component to produce the elapsed power consumption.

13. The method of claim 12, further comprising subtracting the elapsed power consumption from the power capacity of the battery to produce a remaining life of the battery.

14. The method of claim 12, further comprising:

reading a voltage of the battery upon energization of the electronic device;

comparing the voltage to a predetermined threshold; and when the voltage is higher than the predetermined threshold, setting the elapsed power consumption to zero.

15. The method of claim 11, further comprising:

determining a plurality of partial power consumption estimates associated with a second active component of the electronic device, each partial power consumption estimate of the second active component comprising a power consumption rate associated with the second active component in each of a plurality of second operating states of the second active component multiplied by a second elapsed time spent in each of the plurality of second operating states, respectively; and summing the plurality of partial power consumption estimates associated with the second active component with the partial power consumption estimates associated with the first active component to produce an updated elapsed power consumption.

16. The method of claim 15, wherein the plurality of operating states and the plurality of second operating states occur independently of each other.

17. The method of claim 15, wherein the plurality of operating states and the plurality of second operating states comprise a plurality of operating states of the electronic device.

18. The method of claim 15, wherein:

storing a second start time when the second active electronic component changes from a first operating state of the plurality of second operating states to a second operating state of the plurality of second operating states;

storing a power consumption rate of each of the plurality of second operating states associated with the second active electronic component;

determining a second elapsed time between the second start time and a second end time of the first operating state of the plurality of second operating states;

multiplying the second elapsed time by a second power consumption rate associated with the first operating state to produce a second partial power consumption estimate; and adding the second partial power consumption estimate to the elapsed power consumption to produce an updated, elapsed power consumption.

19. The method of claim 11, further comprising:

calculating a plurality of average power consumption rates of the electronic device over a predetermined, sliding time window; and providing the plurality of average power consumption rates of the electronic device to a remote device.

20. The method of claim 11, further comprising:

determining a remaining life of the battery as a difference between a power capacity of the battery minus the elapsed power consumption.

\* \* \* \* \*